(12) United States Patent
Duerr et al.

(10) Patent No.: US 8,319,098 B2
(45) Date of Patent: Nov. 27, 2012

(54) POROUS SEMICONDUCTOR FILM ON A SUBSTRATE

(75) Inventors: Michael Duerr, Esslingen (DE);
Andreas Schmid, Reutlingen (DE);
Gabriele Nelles, Stuttgart (DE); Akio Yasuda, Esslingen (DE)

(73) Assignee: Sony Deutschland GmbH, Koeln (DE)

( * ) Notice: Subject to any disclaimer, the term of this patent is extended or adjusted under 35 U.S.C. 154(b) by 63 days.

(21) Appl. No.: 13/073,543

(22) Filed: Mar. 28, 2011

(65) Prior Publication Data

US 2011/0168242 A1    Jul. 14, 2011

Related U.S. Application Data

(62) Division of application No. 11/578,676, filed as application No. PCT/EP2005/000403 on Jan. 17, 2005, now Pat. No. 7,935,263.

(30) Foreign Application Priority Data

Apr. 23, 2004    (EP) ...................................... 04009742

(51) Int. Cl.
*H01L 51/44*    (2006.01)

(52) U.S. Cl. ........... 136/263; 136/252; 136/250; 438/57

(58) Field of Classification Search ............... 136/43–65; 438/57, 63, 82, 99; 428/141, 201, 352, 354
See application file for complete search history.

(56) References Cited

U.S. PATENT DOCUMENTS

| | | | |
|---|---|---|---|
| 6,190,937 B1 | 2/2001 | Nakagawa et al. | |
| 6,756,289 B1 | 6/2004 | Nakagawa et al. | |
| 2001/0041423 A1 | 11/2001 | Nishida et al. | |
| 2002/0086138 A1* | 7/2002 | Iijima | 428/141 |
| 2004/0002280 A1 | 1/2004 | Abe et al. | |
| 2004/0226602 A1 | 11/2004 | Duerr et al. | |

FOREIGN PATENT DOCUMENTS

| | | |
|---|---|---|
| EP | 1 091 440 | 4/2001 |
| EP | 1 225 034 | 7/2002 |
| WO | WO 99/63599 | 12/1999 |

OTHER PUBLICATIONS

Wang et al. Journal of Crystal Growth, 2002, vol. 236, pp. 627-634.
Petrella et al., Thin Solid Films, 2004, vol. 451-452, pp. 64-68.

* cited by examiner

*Primary Examiner* — Jennifer Michener
*Assistant Examiner* — Jayne Mershon
(74) *Attorney, Agent, or Firm* — Oblon, Spivak, McClelland, Maier & Neustadt, L.L.P.

(57) ABSTRACT

The invention relates to a method of producing a porous semiconductor film and the film resulting from such production. It furthermore relates to an electronic device incorporating such film and to potential uses of such film.

5 Claims, 8 Drawing Sheets spheres:

rods:

[001] direction (a)

(b)

POROUS SEMICONDUCTOR FILM ON A SUBSTRATE

CROSS-REFERENCE TO RELATED APPLICATIONS

This application is a divisional of U.S. application Ser. No. 11/578,676 filed Mar. 23, 2007, the contents of which is incorporated herein in its entirety by reference. U.S. Application Ser. No. 11/578,676 is the National Stage of International Application No. PCT/EP05/00403, filed Jan. 17, 2005, which claims priority to European Application No. 04009742.0 filed Apr. 23, 2004.

The invention relates to a method of producing a porous semiconductor film and the film resulting from such production. It furthermore relates to an electronic device incorporating such film and to potential uses of such film.

Single crystal solar cells show energy conversion efficiencies as high as ~25%. Where the Si-based crystals are no longer single crystals but polycrystalline, the highest efficiencies are in the range of ~18%, and with amorphous Si, the efficiencies are ~12%. Solar cells based on Si are, however, rather expensive to manufacture, even in the amorphous Si version. Therefore alternatives have been developed based on organic compounds and/or a mixture of organic and inorganic compounds, the latter type solar cells often being referred to as hybrid solar cells. Organic and hybrid solar cells have proved to be cheaper to manufacture, but seem to have yet comparably low efficiencies even when compared to amorphous Si cells. Due to their potential inherent advantages such as light weight, low-cost fabrication of large areas, environmentally friendly materials, or preparation on flexible substrates, efficient organic devices might prove to be technically and commercially useful "plastic solar cells". Recent progress in solar cells based on dye-sensitised nanocrystalline titanium dioxide (porous $TiO_2$) semiconductor and a liquid redox electrolyte demonstrates the possibility of a high energy conversion efficiencies in organic materials. (B. O-Regan and M. Grätzel, Nature 353 (1991, 737).

Photoelectrochemical cells based on sensitisation of nanocrystalline $TiO_2$ by molecular dyes (dye sensitised solar cells, DSSC) have attracted great attention since their first announcement as efficient photovoltaic devices (B. O'Regan and M. Grätzel, see above; WO 91/16719). One part of the ongoing investigations is to exploit the potential applicability of such cells on flexible substrates and with this the potential of fabricating flexible solar cells. One of the main challenges to be solved prior to the successful introduction of such flexible DSSC is the restricted range of temperature applicable to plastic substrates. Mostly, the used $TiO_2$ nanoparticles are brought into good electrical contact by the application of temperatures as high as 450° C. Such processes are not applicable on flexible plastic substrates which limits so far the efficiency of cells made of these substrates. With respect to other sintering methods, the most promising way to fabricate flexible DSSCs has been so far to apply high pressures to the $TiO_2$ layer [H. Lindström, et al, A new method for manufacturing nanostructured electrodes on plastic substrates, Nano Lett. 1, 97 (2001); H. Lindström, et al, Method for manufacturing nanostructured thin film electrodes. WO 00/72373; H. Lindström, et al, *A new method to make dye-sensitized nanocrystalline solar cells at room temperature*, J. Photochem. Photobiol. A 145, 107 (2001); G. Boschloo, et al, *Optimization of dye-sensitized solar cells prepared by compression method*, J. Photochem. Photobiol. A 148, 11 (2002).]. Additionally, chemical sintering has been applied with minor success [D. Zhang, et al, *Low-temperature fabrication of efficient porous titania photoelectrodes by hydrothermal crystallization at the solid/gas interface*, Adv. Mater. 15, 814 (2003); D. Zhang, et al, *Low temperature synthesis of porous nanocrystalline $TiO_2$ thick film for dye-sensitized solar cells by hydrothermal crystallization*, Chem. Lett. 9, 874 (2002).]. Combination of both methods, i.e. temperature sintering and chemical sintering leads also only to minor improvements [S. A. Hague, et al, *Flexible dye sensitised nanocrystalline semiconductor solar cells*, Chem. Comm. 24, 3008 (2003)].

The disadvantages of the state of the art of fabricating flexible solar cells can be summarized as follows:

High temperature sintering is used in order to provide a good electrical contact between the semiconductor particles. However, the temperatures required for good electrical contact between the nanoparticles are far higher than can be tolerated by most flexible, i.e. for example polymeric, substrates on which the components of a "plastic solar cell" would have to be applied. Therefore due to the inherent material limits, process parameters need to be compromised with, which effectively from the beginning limits the performance of the solar cell thus produced.

If on the other hand, low temperatures are used (around 200° C.) for sintering, or sintering occurs additionally or alternatively by the application of high pressures, one cannot use organic binders in the initial material. Usually, these organic binders are used in order to control the porosity of the layer containing the semiconductor particles. Subsequently, in the high temperature methods, the organic binders are simply burned away leaving a void space behind. In the low temperature sintering processes, however, these binders cannot be used, since they would simply not be burned away. Therefore, the porosity and, concomitantly therewith, the ionic transport through the pores is effectively decreased. Additionally, the electrical contact between the particles does not reach the quality compared to hot sintered layers. A combination of low temperature sintering and the application of pressure improves the electrical contact to some extent, but the problem of low porosity remains unsolved.

In chemical sintering processes, low temperature activated or non-activated chemical reactions resulting in oxide layers, are used to overcoat the nanoparticles in the porous layers. They form a conductive outer layer, which improves the electrical conductivity of the porous film. However, those films are expected to have a high defect concentration. In addition, it is not clear if transport only occurs in the thin overlayer. In both cases, this leads to a lower performance at higher light intensities, as reported in [Hague et al., see above]. This strongly limits the applicability of those cells.

Accordingly it was an object of the present invention to provide for a method of production that allows to make use of the advantages of the high temperature sintering processes in combination with a flexible substrate, which, as such would not tolerate high temperature sintering processes. Furthermore it was an object of the present invention to provide for a plastic solar cell which can be produced in an inexpensive manner. Furthermore it was an object of the present invention to provide for a plastic solar cell which has efficiencies at least comparable to those reported about in the literature.

All these objects are solved by a method of producing a porous semiconductor film on a substrate, comprising the steps:

a) preparing, on a first substrate, an adhesion layer, capable of providing electrical and mechanical contact between a porous semiconductor layer attached to said adhesion layer, and said first substrate, b) preparing a porous semiconductor layer on a second substrate, c) transferring said porous semiconductor layer onto said adhesion layer, and optionally, after step b) or c), preparing a second, third, fourth, fifth . . . n-th porous semiconductor layer on a third, fourth, fifth . . . n-th, (n+1)-th substrate, and transferring said second, third, fourth, fifth, . . . n-th porous semiconductor layer onto said first, second, third, fourth, . . . and (n−1)-th porous semiconductor layer respectively, n being an integer from 2 to 100, preferably from 2 to 20, more preferably from 2 to 10, and furthermore, optionally, preparing on one, some or each of the second, third, fourth, fifth . . . n-th porous semiconductor layer, further adhesion layer(s) onto which the respective subsequent semiconductor layer is transferred.

As an example, if a second porous semiconductor layer is prepared on a third substrate it will be transferred onto said first porous semiconductor layer which itself has been transferred onto said adhesion layer. Additionally, there may also be present an additional adhesion layer between said first and said second porous semiconductor layer. In a preferred embodiment, the porous semiconductor film on a substrate comprises a sequence of alternating adhesion layers and porous semiconductor layers which are stacked on top of each other and which have been prepared by the aforementioned steps a) to c) and possibly the substeps ba), bb), bc), ca), cb) and cc)(see below for these substeps).

In one embodiment said adhesion layer is transparent, semi-transparent or opaque. Preferably it is transparent. In another embodiment it is opaque and thus more light-scattering.

In one embodiment, said porous semiconductor layer is transparent, semi-transparent or opaque.

In one embodiment said second, third, fourth etc. semiconductor layer is transparent, semi-transparent or opaque. In one embodiment subsequent semiconductor layers are increasingly opaque, thus causing a greater scattering. In one embodiment, the opacity of an individual porous semiconductor layer changes, preferably increases, over the respective individual layer's thickness. This may apply in films comprising only one porous semiconductor layer, or in films comprising several porous semiconductor layers.

In one embodiment step c) comprises the steps:
ca) separating said porous semiconductor layer from said second substrate,
cb) optionally dyeing said porous semiconductor layer, preferably using a dye useful for dye sensitized solar cells,
cc) transferring said porous semiconductor layer without said second substrate onto said adhesion layer.

Preferably, step b) comprises the steps:
ba) preparing said porous semiconductor layer on said second substrate by a method selected from printing, in particular screen printing, doctor blading, drop casting, spin coating, ink-jet printing and spraying,
bb) sintering said porous semiconductor layer, and optionally,
bc) dyeing said porous semiconductor layer, preferably using a dye useful for dye sensitised solar cells.

In one embodiment in step a) said adhesion layer is prepared on said first substrate by a method selected from printing, in particular screen printing and/or ink-jet-printing, doctor blading, drop casting, spin coating, sputtering, sol gel methods, and spraying.

In a further embodiment said adhesion layer has also the function of being a blocking layer between said first substrate and the later-applied electrolyte to prohibit direct contact between the two. To fulfill such a function, said adhesion layer might be composed of two sub-layers, one of the sub-layers, preferably the lower sublayer being the blocking layer and the other sublayer being the adhesion layer. The lower part (blocking layer) may be prepared, among others, by means of sputtering methods, preferably suitable for plastic substrates, or sol gel methods.

Preferably, step ca) comprises the lifting-off of said porous semiconductor layer from said second substrate, wherein, preferably, the lifting-off occurs by removal of said second substrate or parts of it from said porous semiconductor layer, and wherein, more preferably, said removal is performed by physical methods, e.g. peeling, and/or chemical methods, e.g. etching and/or oxidation.

In one embodiment said transfer of step c) is performed, while said porous semiconductor layer is in a wet or dry state, wherein, preferably, said transfer is achieved by a roll-to-roll-technique.

In one embodiment, the method according to the present invention, additionally comprises the step
d) sintering and/or pressing of a composite, comprising, in that order and on top of each other, said first substrate, said adhesion layer, and said porous semiconductor layer.

In one embodiment said sintering of step bb) occurs at a temperature in the range of from 300° C.-500° C., preferably >350° C., more preferably >380° C., most preferably >400° C.

In one embodiment said sintering in step d) occurs at a temperature in the range of from 50° C. to $\leq$200° C., and/or said pressing occurs with a pressure in the range of from 0-12×10$^4$ N/cm$^2$.

Preferably, said adhesion layer is a layer of semiconductor particles, preferably oxide particles, more preferably $TiO_2$-particles, in particular anatase —$TiO_2$ particles.

It is clear to someone skilled in the art that a wide variety of semiconductor particles can be used for practicing the present invention. Examples of these are, without being limited thereto: $TiO_2$, $SnO_2$, ZnO, $Nb_2O_5$, $ZrO_2$, $CeO_2$, $WO_3$, $SiO_2$, $Al_2O_3$, $CuAlO_2$, $SrTiO_3$ and $SrCu_2O_2$, or a complex oxide containing several of these oxides.

In one embodiment said porous semiconductor layer is a layer of semiconductor particles, preferably oxide particles, more preferably $TiO_2$-particles, in particular anatase —$TiO_2$ particles, wherein, preferably, said porous semiconductor layer comprises semiconductor particles having sizes in the range of from about 10 nm to 1000 nm, preferably 10 nm to 500 nm.

In one embodiment said porous semiconductor layer has a porosity in the range of from 30% to 80%, as measured by nitrogen adsorption techniques. In this context and as used herein, a film having x % porosity means that x % of the total volume occupied by the film are void space.

In one embodiment said porous semiconductor layer is a composite layer comprising a first sublayer and a second sublayer adjacent to said first sublayer, wherein said first sub-layer comprises spherical nanoparticles and said second sublayer comprises elongated rod-like nanoparticles. Preferably, said nanoparticles are semiconductor nanoparticles.

Preferably, said spherical nanoparticles have a size in the range of from about 10 nm to about 500 nm, more preferably about 10 nm to about 250 nm, and said elongated rod-like particles have an average length along their longest dimension of 10 nm to 500 nm, preferably around 50 nm to 200 nm. In one embodiment, the ratio between the longest axis and shortest axis of the elongated rod-like particles is 2 or larger. In a preferred embodiment, the ratio between the longest axis and shortest axis is between 2 and 10.

In another embodiment, said rod-like nanoparticles are fibers with a ratio between longest axis and shortest axis between 20 and 1000.

In one embodiment, said first sublayer with spherical nanoparticles contains also rod-shaped nanoparticles and said second sublayer with rod-shaped nanoparticles contains also spherical nanoparticles, however the content of rod-shaped particles in the first layer is less than the content of rod-shaped particles in the second layer and the content of spherical nanoparticles in the second layer is less than the content of spherical particles in the first layer. Whenever sublayers are referred to in this application as "sublayers containing spherical nanoparticles" or "sublayers containing elongated rod-like particles" these terms also include the aforementioned possibility of the respective sublayer containing also nanoparticles of the "other" kind.

In one embodiment, however, said first sublayer of spherical nanoparticles exclusively contains spherical nanoparticles and said second sublayer of elongated rod-like nanoparticles exclusively contains elongated rod-like nanoparticles.

In one embodiment, said porous semiconductor layer is composed of a mixture of spherical and elongated rod-like nanoparticles with the content of the rod-like nanoparticles gradually increasing from the bottom of the layer to the top of the layer, or vice versa.

In one embodiment the rod-like nanoparticles are nanotubes.

In one embodiment, in said porous semiconductor film on a substrate, said first sublayer is facing said adhesion layer and said second sublayer is further removed from said adhesion layer In another embodiment, in said porous semiconductor film on a substrate, said second sublayer is facing said adhesion layer and said first sublayer is further removed from said adhesion layer.

Preferably, said first and said second sublayer have a thickness in the range of from 1 µm to 20 µm each.

Preferably, said second substrate is a substrate capable of withstanding temperatures $\geq 350°$ C., preferably $\geq 400°$ C., and wherein, preferably, said second substrate is made of glass or metal, preferably steel, or glass with one or several additional layers on top of it, e.g. metal layers.

In one embodiment said second substrate additionally comprises a spacer layer, upon which said porous semiconductor layer is prepared, wherein, preferably said spacer layer can be removed by chemical and/or physical methods, thereby allowing the lifting-off of said porous semiconductor layer.

In one embodiment said spacer layer is organic, inorganic, metal, preferably gold, or a combination thereof, wherein, preferably, said spacer layer is made of gold, and removal thereof occurs by oxidation, e.g. by treatment with an oxidising agent, for example a strong acid, or a redox couple, e.g. iodine/iodide.

Preferably, said porous semiconductor layer has a thickness in the range of from about 1 µm to about 50 µm.

In one embodiment said adhesion layer is a layer of semiconductor particles having sizes in the range of from about 10 nm to about 100 nm, preferably 10 nm-50 nm, more preferably 10 nm-20 nm.

Preferably, said adhesion layer has a thickness in the range of from 10 nm to 1 µm, preferably a thickness <500 nm, more preferably $\leq 100$ nm.

In one embodiment said first substrate is made of flexible material, which, preferably is incapable of withstanding sintering procedures at temperatures >250° C.

The objects of the present invention are also solved by a porous semiconductor film, produced by the method according to the present invention.

The objects are furthermore solved by a porous semiconductor film, preferably produced by a method according to the present invention, comprising, on a substrate:

a sequence of alternating adhesion layers and porous semiconductor layers on top of each other, said layers being as defined above, preferably with said porous semiconductor layers having been dyed or dye sensitized with one or several dyes, with subsequent porous semiconductor layers, due to the presence of a respective dye, having the center of mass of absorption shifted to longer wavelengths than the previous porous semiconductor layer, said previous porous semiconductor layer being closer to the substrate.

The terms "dyed" and "dye sensitized", as used herein, are used interchangeably.

In one embodiment, the porous layers are dyed before the transfer onto the corresponding adhesion layers. The absorption range of the dyed porous layers may vary. Preferably, the first porous layer absorbs in a shorter wavelength region with the center of mass of absorption of the subsequent layers shifting subsequently to longer wavelengths.

They are furthermore solved by a porous semiconductor film, preferably produced by the method according to the present invention, comprising, in that order:

a first substrate, preferably a flexible substrate, which, more preferably, is incapable of withstanding sintering temperatures >250° C., an adhesion layer, capable of providing electrical and mechanical contact between a porous semiconductor layer attached to said adhesion layer, and said first substrate, said adhesion layer being a layer of semiconductor particles, preferably in the range of from 10 nm to 100 nm, more preferably 10 nm to 50 nm, most preferably, 10 nm to 20 nm, having a porosity of 30%-80%, with an average pore size in the range of from 1 nm to about 100 nm.

a porous semiconductor layer, comprising semiconductor particles having sizes of from about 10 nm to about 1000 nm, and having a pore size in the range of from about 3 nm to about 500 nm, said porous semiconductor layer having a thickness in the range of from about 1 µm to about 50 µm and a porosity in the range of from 30% to about 80%, as measured by nitrogen adsorption techniques.

The objects of the present invention are also solved by an electronic device comprising a porous semiconductor film according to the present invention, wherein, preferably, said electronic device is a solar cell, and wherein, more preferably, said solar cell has a power conversion efficiency of >5%. In one embodiment said solar cell has a relative porosity of $\geq 75\%$, preferably $\geq 80\%$, after a pressure of up to $6 \times 10^4$ N/cm$^2$, preferably up to $10 \times 10^4$ N/cm$^2$ has been applied to said porous semiconductor film, said relative porosity being defined with respect to the unpressed film. In another embodiment, said electronic device is a sensor device.

The objects of the present invention are furthermore solved by the use of the method according to the present invention for producing an electronic device, in particular a solar cell.

They are also solved by the use of the porous semiconductor film according to the present invention in an electronic device, preferably a solar cell.

The objects of the present invention are also solved by a porous semiconductor layer comprising a first sublayer of spherical nanoparticles and a second sublayer of elongated rod-like nanoparticles adjacent to said first sublayer. Preferably, said nanoparticles are semiconductor nanoparticles. Such a semiconductor layer comprising a first sublayer of spherical nanoparticles and a second sublayer of elongated rod-like nanoparticles adjacent to said first sublayer is also sometimes herein referred to as a "composite layer".

Preferably such a composite layer of spherical and rod-like nanoparticles exhibits a difference in the thermal expansion coefficient between the two different sub-layers.

Such a composite layer is herein also sometimes referred to as a "sphere-rod composite layer" or "SRCL" As used herein, the term "sphere-rod composite layer" is meant to designate any layer comprising a sublayer of spherical nanoparticles and another sublayer of elongated rod-like particles, adjacent to it. It is clear to someone skilled in the art that the terms "spherical" and "elongated rod-like" are only approximate terms and can be used to also describe particles which are not entirely "spherical" or not entirely "rod-like" in a strict geometrical sense, yet whose appearance is still adequately described by these terms.

The term "adjacent to" is meant to designate the spatial arrangement of two entities which are next to each other. In one embodiment, the two sublayers adjacent to each other are in direct contact with each other. In another embodiment the two sublayers adjacent to each other are separated by an intermediate spacer layer, the dimensions of which may be very small in comparison to the thickness of each sublayer. In a preferred embodiment, however, the two sublayers adjacent to each other are in direct contact with each other.

In one embodiment, said spherical nanoparticles have a size in the range of from about 10 nm to about 500 nm, more preferably 10 nm to about 250 nm, and said elongated rod-like particles have an average length along their longest dimension of 10 nm to 500 nm, preferably around 50 nm to 200 nm. In a preferred embodiment, the ratio between the longest axis and the shortest axis of the elongated rod-like particles is 2 or larger. In a more preferred embodiment, the ratio between the longest axis and the shortest axis is between 2 and 10.

In one embodiment, said composite layer of spherical and rod-like particles has a thickness in the range of from about 2 μm to 50 μm, preferably from about 2 μm to about 40 μm.

Preferably said semiconductor particles are oxide particles. Examples of these are, without being limited thereto: $TiO_2$, $SnO_2$, $ZnO$, $Nb_2O_5$, $ZrO_2$, $CeO_2$, $WO_3$, $SiO_2$, $Al_2O_3$, $CuAlO_2$, $SrTiO_3$ and $SrCu_2O_2$ More preferably said semiconductor particles are $TiO_2$-particles, in particular anatase-$TiO_2$-particles.

In one embodiment, said sphere-rod composite layer has a porosity in the range of from 30% to 80%, as measured by nitrogen adsorption techniques. In this context and as used herein, a film or a layer having x % porosity means that x % of the total volume occupied by the film or layer are void space.

The inventors have surprisingly found that such a SRCL can be lifted off a substrate much more easily in comparison to non-composite layers. Hence, such a SRCL can be used and applied in any method involving the lifting of a layer, preferably a semiconductor layer off a substrate.

The present inventors have also surprisingly found that the above-mentioned disadvantages in fabricating flexible DSSCs can be overcome in general by the application of a transfer method for the porous $TiO_2$ layer. This method combines the advantage of the hot temperature sintering of the active porous layer (good electrical contact, good porosity, good mechanical stability) with the possibility to apply such a porous layer on flexible plastic substrates and to bring them in good electrical contact. It ensures the full freedom in the choice of the parameters of the porous layer to be transferred and with this optimal electrical and optical properties of the layer. Its principle is based on the separation of layer preparation and contacting to the substrate. That means that the active porous layer is prepared on a substrate, which can withstand high temperatures (spare substrate). After successful preparation of this layer, it is removed from the spare substrate and transferred onto another substrate (e.g. incapable of withstanding high temperature sintering processes). To bring it in good mechanical and electrical contact with this other substrate (the "first" substrate according to the terminology of the appended claims), a spacer or adhesion layer exists between the flexible substrate and the transferred porous layer which spacer or adhesion layer is capable of providing electrical and mechanical contact between the flexible substrate and the transferred porous layer. As used herein, the term "adhesion layer" is meant to denote any layer which provides adhesion between a substrate (which itself may for example be covered by a TCO layer) and another layer, preferably a porous semiconductor layer, to be affixed to said substrate, or it provides adhesion between two adjacent layers, preferably two subsequent porous semiconductor layers. It has been found that good results can be obtained when this spacer layer or adhesion layer consists of a very thin layer of nanoporous semiconductor particles, preferably $TiO_2$ particles. To bring the transferred porous layer (herein also sometimes referred to as "transfer layer"), the nanoporous adhesion layer and the substrate into good electrical contact, different low temperature sintering processes, as e.g. heating to only 200° C., pressing, and/or chemical sintering are sufficient and may be applied. Since the adhesion layer is much thinner than a standard porous layer employed in DSSC, the above-mentioned disadvantages of those methods are much less important than if applied to the active porous layer. E.g., pressing does not affect the good properties of the transfer layer but enhances the electrical contact between the nanoparticles of the adhesion layer and the contact between the electrode, the adhesion layer, and the transfer layer. Best results have been found so far for a combination of heating and pressing.

It is clear to someone skilled in the art that the semiconductor particles used in the porous semiconductor layer (herein also sometimes referred to as "transfer layer") and/or the adhesion layer may take any shape, unless explicitly specified as in the case of the SRCLs. They may be for example spheres, rods or tubes. They may take any aspect ratio, and different diameters and shapes may be mixed. Likewise mixed multilayer-structures may be applied. In one embodiment, subsequent layers, i.e. the adhesion layer and subsequent semiconductor layers may be increasingly scattering; i.e. less transparent than the immediately preceding neighbouring layer. This increasing scattering effect may be due to the different composition of each layer, with subsequent layers having differently sized and/or shaped particles, and the mean sizes of the particles increase from layer to layer. Preferably, the surface roughness of the respective layer should not be substantially larger than the size(s) of the smaller particles, preferably the size(s) of the smaller particles of the respective layer. This is to ensure a smooth surface transition and a good contact between the two layers. Furthermore, it is possible, to add fibres into the porous semiconductor layer for a better stability of this layer. The preferred thickness of the porous semiconductor layer is about 1 μm to about 50 μm. The porous semiconductor layer, at first, may be prepared on any kind of substrate, which is preferably, flat and temperature resistant, i.e. it can withstand high temperature sintering processes, such as are used for sintering semiconductor layers (e.g. temperature range from 350° C.-500° C.). Alternatively, this substrate may simply resemble the shape or have the same shape as the substrate, on which the adhesion layer is prepared. A preferred substrate material is glass or steel, but others can be used. The porous semiconductor layer may be prepared by any suitable means including but not limited to printing, in particular ink-jet printing, screen printing, doctor blading, drop casting, spin coating and spraying. One preferred method of preparing the porous semiconductor layer is ink-jet printing, since in this method control can be precisely exerted on the thickness of the layers applied, and extremely thin layers corresponding to about 1-5 monolayer, if desired, can be generated, with one monolayer corresponding to the thickness of a single particle. However, ink-jet printing is also perfectly suitable for preparing thicker layers in the μm-range, such as for example from 2 μm to 50 μm. Another particularly preferred method for preparing the porous semiconductor layer is screen printing. One method of transferring the porous semiconductor layer from the substrate on which it has been produced, to the adhesion layer is the presence of a spacer layer on the substrate on which the semiconductor layer has been produced. This spacer layer may facilitate the removal of the porous semiconductor layer from the substrate on which it was produced, after the porous semiconductor layer has been sintered. Such a spacer layer may comprise organic or inorganic materials, it may comprise metals, in particular gold. The spacer layer may be removed by chemical, physical or other methods, which are apparent to someone skilled in the art. For example gold may be oxidised by treatment with an oxidising agent, for example a strong acid, and/or a redox-couple, e.g. iodine/iodide. As a result of such removal, the porous semiconductor layer may be lifted off the substrate on which it had been produced and be transferred to the adhesion layer. The porous semiconductor layer is the layer which is the main "active" layer of the electronic device, meaning the location where the light absorption, charge separation and transfer processes mainly take place.

In preferred embodiment, the semiconductor layer is a composite layer comprised of two different sublayers of spherical and rod-like semiconductor nanoparticles, respectively. Such a SRCL (sphere-rod composite layer) can be lifted off a substrate much more easily and therefore facilitates any process wherein a lifting off a semiconductor film from a substrate is required.

The present inventors found that the lift-off process described above is significantly facilitated by the application of sphere-rod composite layers (SRCL) as shown in FIG. 6. Without wishing to be bound by any theory, the effect can be described as follows:

Firstly, the inventors measured the time necessary for the removal of the porous layers from the spare substrate in iodine/iodide electrolyte without any additional mechanical force other than gravity for the following: SRCLs, homogeneous porous layers, and porous layers consisting of two sub-layers—the latter consisting of either small particles of identical geometrical shape (10 to 20 nm in diameter) in both sub-layers or small particles in the lower sublayer and bigger particles of the same geometrical shape (300 nm in diameter) in the upper sub-layer. The average time for all the reference layers exceeded the average time for the SRCLs by at least one order of magnitude. The comparison of data for SRCLs and double layers consisting of two sub-layers of nanospheres is shown in FIG. 8. The inventors propose that, without wishing to be bound by any theory, the most likely explanation for these observations is that internal stresses in the SRCL, due to different expansion/contraction during the formation of the layer in the high temperature sintering process and during the subsequent cooling down, may cause the easier removal from the spare substrate. However, since both spheres and rods in the particular embodiment used for exemplification, are anatase $TiO_2$ single crystals as has been confirmed by X-ray diffraction, the effect cannot be purely due to different crystallographic properties in the two layers but must be instead correlated to the nanomorphology of the film. Indeed, whereas closed-packed structures consisting of either randomly arranged bulk polycrystalline material, single crystalline rods, or single crystalline spheres, are expected to exhibit the same averaged thermal expansion coefficient, yet nanoporous structures allow for a deviation depending on the shape of the nanoscale building blocks as will be explained in the following. The $TiO_2$ nanorods are grown by means of a template method. It is based on the preferential adsorption of some surfactants on surfaces of selected crystallographic orientation. In the case of diethylenetriamine, as used here for the nanorod synthesis, adsorption takes place preferentially on planes parallel to the [001] direction or c-axis of the anatase lattice (see also FIG. 7 for the nomenclature of axes and directions). Since the surfactants slow down the crystal growth along the direction perpendicular to those planes, the longer axis of all nanorods is expected to coincide (within some deviation) with the [001] direction, and this indeed has been verified by means of transmission electron microscopy. On the other hand, the thermal expansion coefficients, α, for anatase $TiO_2$ are known to be strongly dependent on crystallographic orientation with even negative expansion along the a-direction, i.e. perpendicular to [001] ($\alpha_a=-2.88\times10^{-6}$, $\alpha_c=6.6424\times10^{-6}$, both at room temperature). In the one-dimensional model of FIG. 7 (one-dimensional in the sense that the model only accounts for different expansion coefficients along the chain of nanoparticles) with the c-axis of either the spherical or the rod-like particles oriented randomly in all three directions, there is a difference in the macroscopic thermal expansion coefficient because the long axis of the rods contributes more to the total length of the chain of nanoparticles as shown in FIG. 7) than the short axis. Although this model oversimplifies the situation in the nanoporous network, based on these considerations a difference in the macroscopic thermal expansion coefficient is expected for the porous layers consisting of either spheres or rods. Furthermore, because the layer structure is formed during the sintering cycle at 450° C., even small differences in α are sufficient to account for the internal stress observed at room temperature. Indeed, when the inventors measured the thickness of porous layers between room temperature and 300° C. by means of optical interferometry, they found a different behaviour of standard layers and SRCLs. For the standard layers, a decreasing thickness with increasing temperature is observed. This is attributed to a shrinking of the layer due to a stronger lateral expansion of the glass substrate when compared with the film itself. However, for the nanorod layers, they do not observe a shrinking which can be interpreted in terms of a more positive expansion coefficient of the nanorod layers. In short, the shape of the $TiO_2$ on the nanometer scale, in combination with the nanoporous arrangement of the particles in the layer, are correlated to the macroscopic differences in the mechanical properties of the layers leading to the optimization of the lift-off process.

As far as the adhesion layer is concerned, which itself does not have to take part in the active processes of the electronic device in which the porous semiconductor film is to be used, this adhesion layer may be comprised of any material which may be formed into a thin, transparent layer and which can supply a good electrical and mechanical contact between the porous semiconductor layer and the substrate (for example an electrode). The material of the adhesion layer may be nanoporous, meaning that the average pore size within the adhesion layer is in the range of from 1 nm to 100 nm. In a preferred embodiment, the nanoporous particles of the adhesion layer are semiconductor particles, preferably oxide particles, more preferably $TiO_2$-particles. It is clear to someone skilled in the art, that also these particles may take any shape, for example they may be spheres, rods or tubes. Their preferred sizes are in the range of from about 10 nm to about 100 nm, but it has to be emphasised, that, preferably, the surface roughness of the respective layer should not be substantially larger than the size(s) of the smaller particles, preferably the size(s) of the smaller particles of the respective layer. Again at the interface between the adhesion layer and the porous semiconductor layer, the particles of the adhesion layer are relatively small in order to ensure a smooth surface and a good contact between the two layers. The preferred thickness of the adhesion layer is between about 10 nm to about 1 µm, but embodiments with a thickness <500 nm are preferred. Embodiments having a thickness ≦100 nm are even more preferred. The adhesion layer may be applied by any means, including but not limited to printing, in particular ink-jet printing, screen printing, doctor blading, drop casting, spin coating and spraying. One preferred method of applying the adhesion layer is ink-jet-printing, since in this method, control can be precisely exerted on the thickness of the layers applied, and extremely thin layers, corresponding to about 1-5 monolayers can be generated, with one monolayer corresponding to the thickness of a single particle. In principle, any substrate for the adhesion layer is possible, but for the purpose of producing "plastic solar cells", of course, relatively flexible substrates are preferred. It is clear to someone skilled in the art, that a number of materials can be used for such flexible substrates, including but not limited to polymeric materials. Also, the substrate may be flat or take on any other shape. In a preferred embodiment, when the substrate is a flexible polymeric substrate, it only can withstand temperatures up to a certain limit, for example 200° C.

The transfer of the porous semiconductor layer from the first substrate on which it has been produced to the substrate which is to be the one also used in the electronic device, any technique suitable for that purpose can be applied. Such techniques are known to someone skilled in the art and include, but are not limited to roll-to-roll-techniques. During transfer, the porous semiconductor layer may be in a wet or dry state. After the porous semiconductor layer has been transferred to the adhesion layer a low temperature sintering and/or the application of pressure may ensue. Preferred temperature values for low temperature sintering are ≦200° C.

Preferred pressures are in the range of $2 \times 10^4$ N/cm²-$12 \times 10^4$ N/cm². It is clear to someone skilled in the art that the present invention is not limited to a single adhesion layer and a single porous semiconductor layer. The present inventors also envisage other composites with more than one semiconductor layer and/or more than one adhesion layer.

Once a composite comprising at least a substrate, a transparent adhesion layer and a porous semiconductor layer has been produced, this may be used for the production of for example a solar cell. Solar cells and their other components are known to someone skilled in the art, i.e. it will include an electrolyte, the porous semiconductor layer will be treated with a dye in order to dye-sensitise it. As electrode material those materials may be used which are not temperature resistant, because they do not need to be subjected to high temperature sintering processes. Such materials for making up the electrodes are known to someone skilled in the art and comprise but are not limited to metals, organic materials, e.g. highly doped poly(3,4-ethylene dioxide thiophen) (PEDOT or PEDT), and derivatives and TCO-layers (transparent conductive oxide). The same applies for the counter electrode which may be an organic material, a TCO-material, and/or a metal, for example platinum. Exemplary TCO-materials are, without being limited thereto, FTO, ITO, ZnO, $SnO_2$ and combinations thereof.

It is also clear to someone skilled in the art that there exist a wide variety of flexible substrates. For example, flexible, mainly polymeric (with the exception of steel) substrates may be used, such as but not limited thereto: polyethylene terephthalate (PET), polyethylene naphthalate (PEN), polyethersulfone (PES), polyimide (Kapton), polyetheretherketone (PEEK), polyetherimide (PEI), stainless steel, OHP (overhead transparencies).

Reference is now made to the figures wherein

Figure 8:
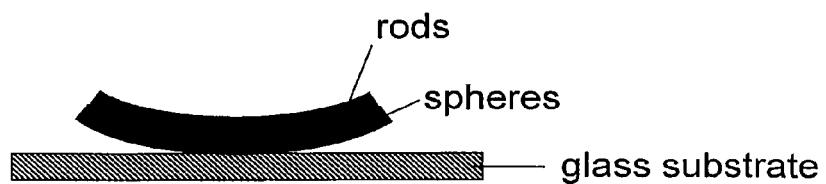
Figure 8:
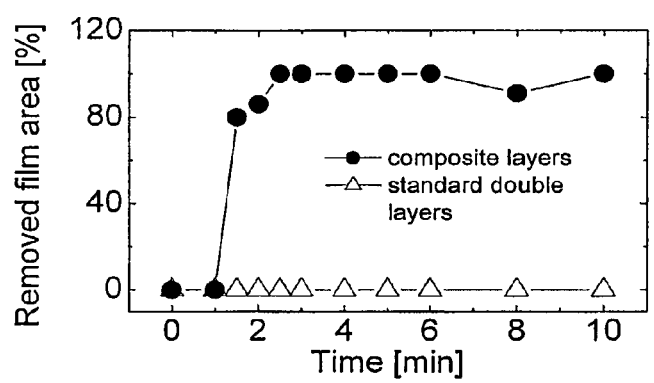

FIG. 8a) shows the schematics of an improved lift-off, presumably due to a different thermal expansion in the nanorod sublayer in comparison to the nanosphere sub-layer.

FIG. 8b) shows a comparison of the time needed for lifting off standard double layers (having particles of different sizes but like shape) and sphere-rod composite layers according to the present invention.

The invention will now be further described by reference to the following examples which are presented to illustrate, not to limit the present invention.

EXAMPLE 1

Figure 1:
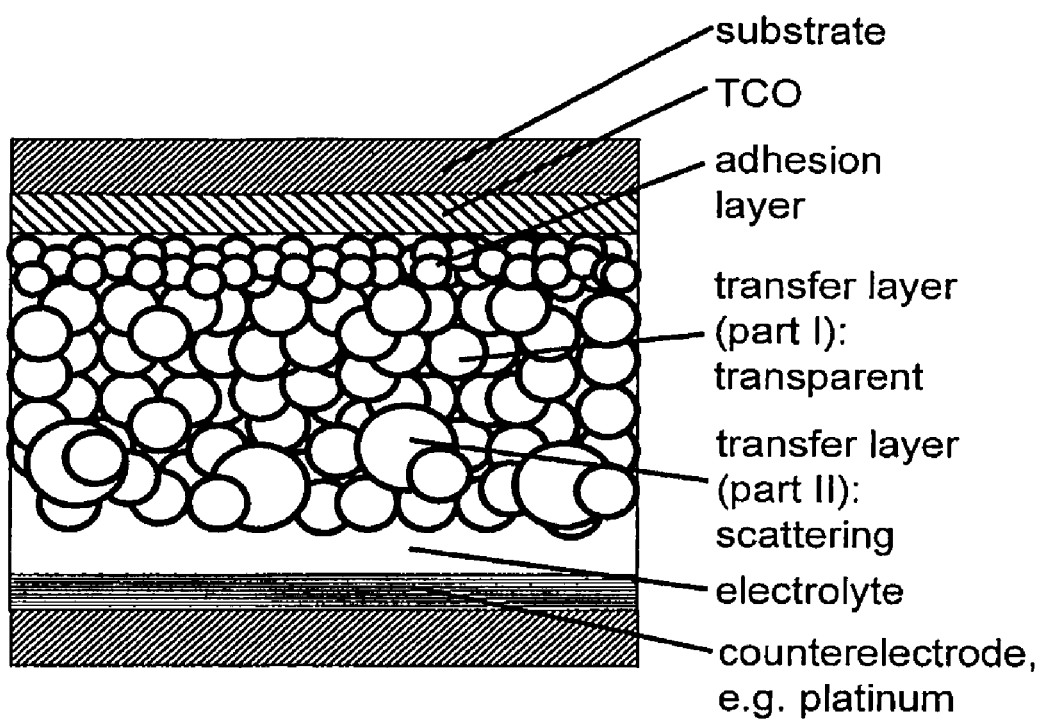
FIG. 1 shows the schematics of a cell made by means of the transfer techniques/lift-off-techniques described according to the present invention.

A schematic view of the DSSC made by means of the above described lift-off techniques is shown in FIG. 1. In a typical cell produced according to the method of the invention, the substrate is covered with a transparent conductive oxide layer (TCO, approx. 100 nm). On the TCO, a thin adhesion layer of approx. 100 nm thickness consisting of $TiO_2$ nanoparticles with about 14 nm in diameter ensures the contact between the TCO and the active porous layer (the porous semiconductor layer or transfer layer) which has been transferred onto the substrate after sintering on another substrate. The active porous layer consists of a double structure with an approx. 8 μm thick sub-layer consisting of 20 nm particles (Part I in FIG. 1) and a 2 μm thick sub-layer consisting of a mixture of 20 nm and 300 nm particles (Part II in FIG. 1). One possibility to remove the active layer from the spare substrate is to sinter it on a thin gold layer. After sintering, the gold is dissolved, e.g. with an iodine/iodide mixture, and the active layer is transferred in a solvent from the spare to the real substrate. After drying the transfer and adhesion layer at 85° C. and a low temperature sintering of the adhesion layer at 200° C. and 60 kN/cm$^2$, red dye molecules (=(cis-bis(isothiocyanato)bis (2,2'-bipyridyl-4,4'-dicarboxylic acid) ruthenium (II))) are attached as a monolayer to the TiO$_2$ via self-assembling out of a solution in ethanol (0.3 mM). The dye sensitised porous layer is filled with a polymer electrolyte (PEO in PC/EC) with iodine/iodide (0.015M) serving as redox-couple. A 6 μm thick bulk layer of the same polymer electrolyte bridges the gap between porous layer and a flat, smooth platinum film (50 nm) applied on a substrate of any kind. To avoid direct contact between the TiO$_2$ layer and the platinum counter electrode, inert spacers, e.g. balls made of glass or spacer foil, are introduced between the two electrodes.

Figure 2:
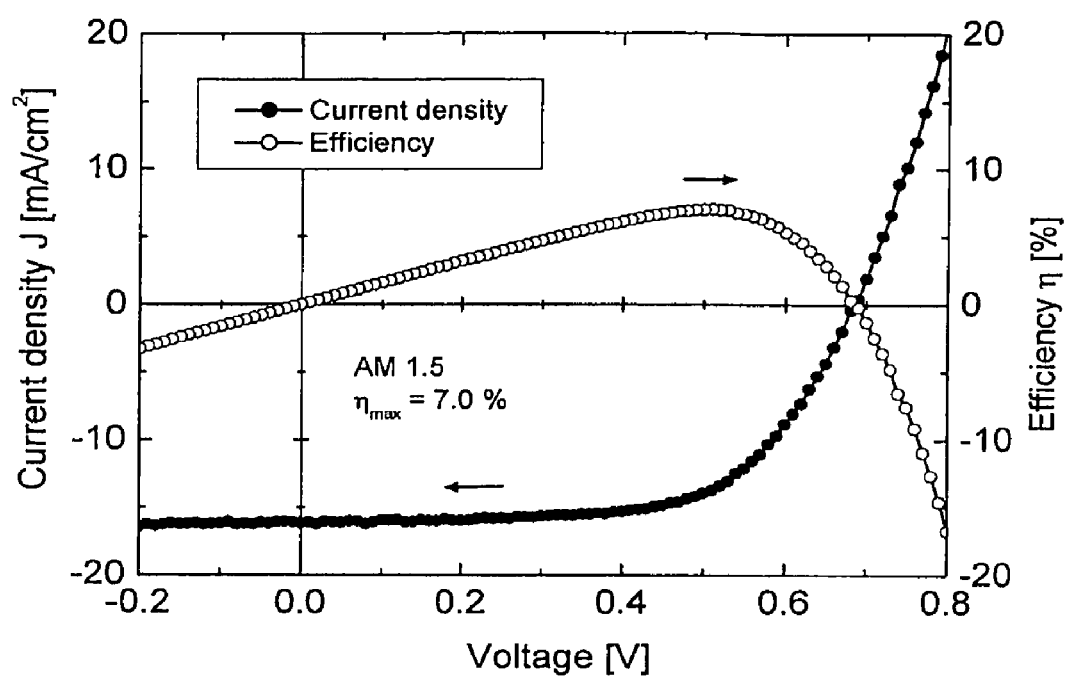
FIG. 2 shows the I-V-characteristics of a lift-off-fabricated DSSC, i.e. produced according to the present invention. The temperature applied for sintering of the adhesion layer was 200° C., the applied pressure was 60 kN/cm²; measured with simulated sunlight at 100 mW/cm², AM 1.5.
Figure 3:
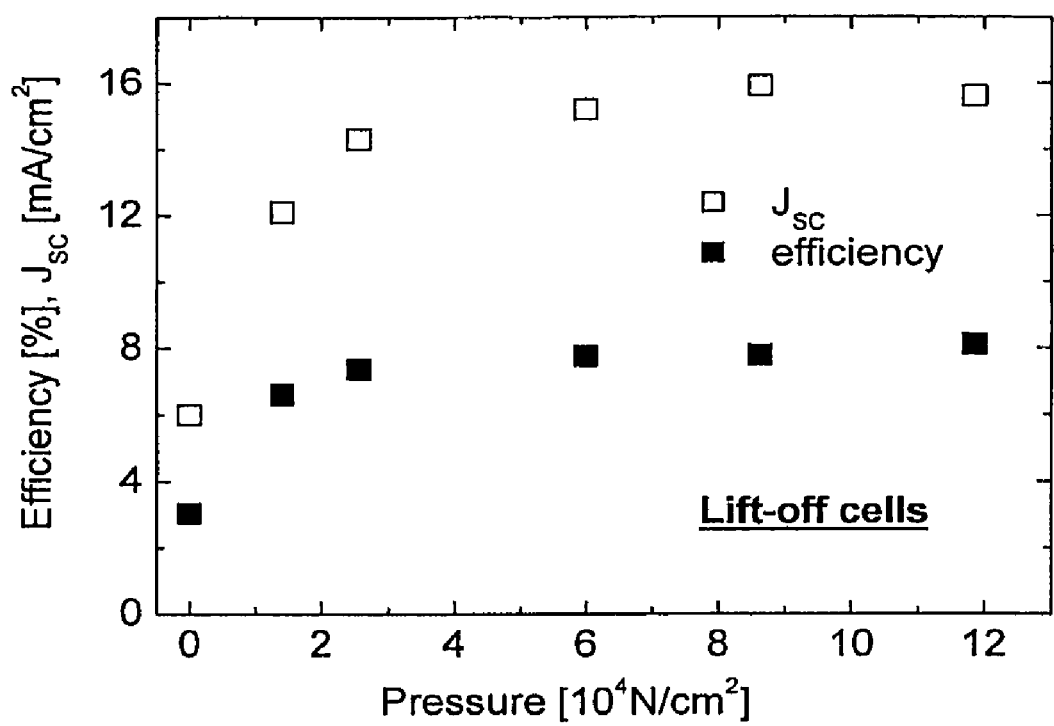
FIG. 3 shows the efficiency and short circuit current density $J_{sc}$ of DSSC according to the present invention as a function of applied pressure. The pressing temperature was room temperature; measured using a sulfur lamp with white light, at 100 mW/cm².
Figure 4:
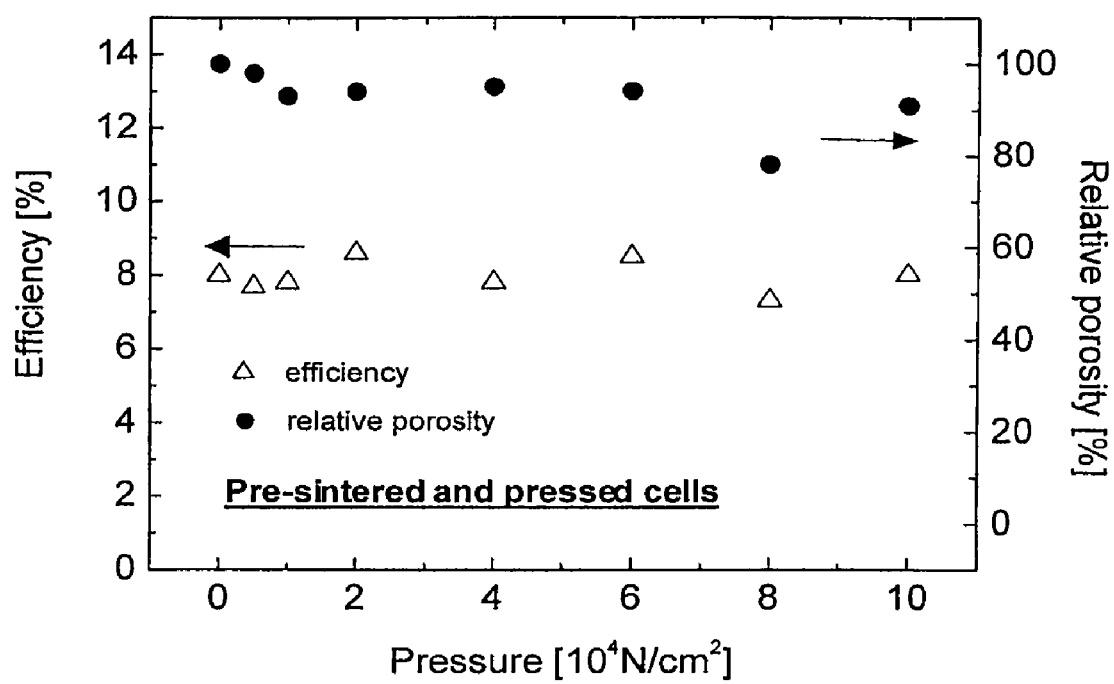
FIG. 4 shows the efficiency and relative porosity of DSSC according to the present invention as a function of applied pressure. The pressing temperature was room temperature. 100% relative porosity means the porosity of a cell before any external pressure is applied.
Figure 5:
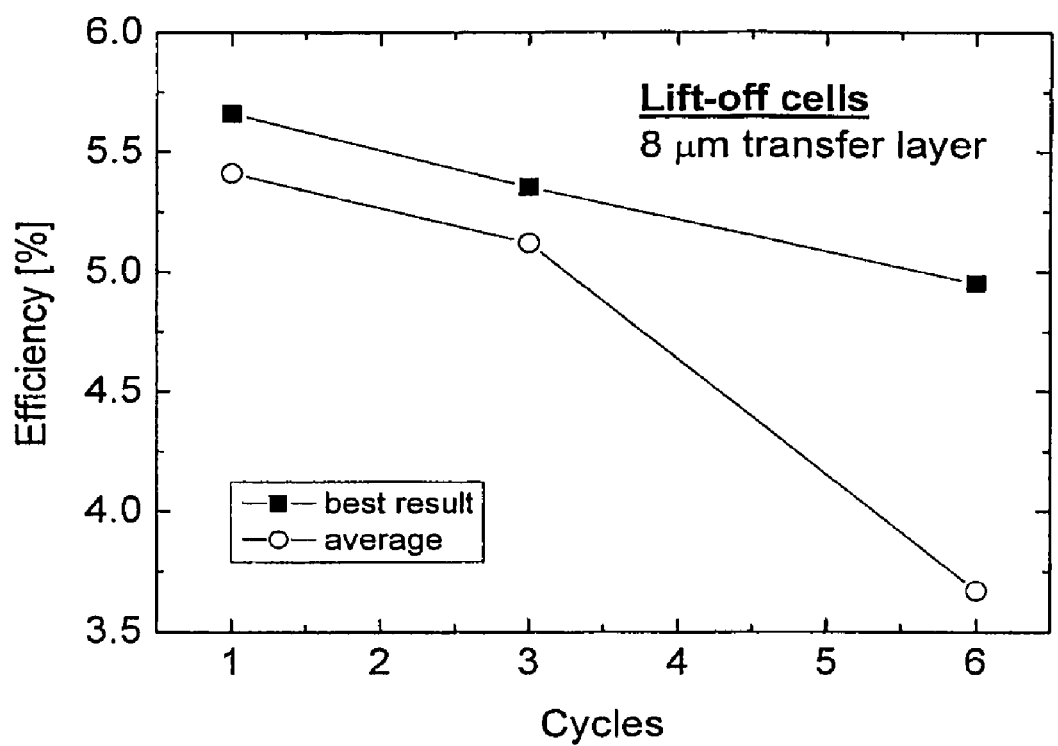
FIG. 5 shows the efficiency of lift-off-cells according to the present invention as a function of adhesion layer thickness. Cells were sintered at 200° C. only, no pressure was applied.
Figure 6:
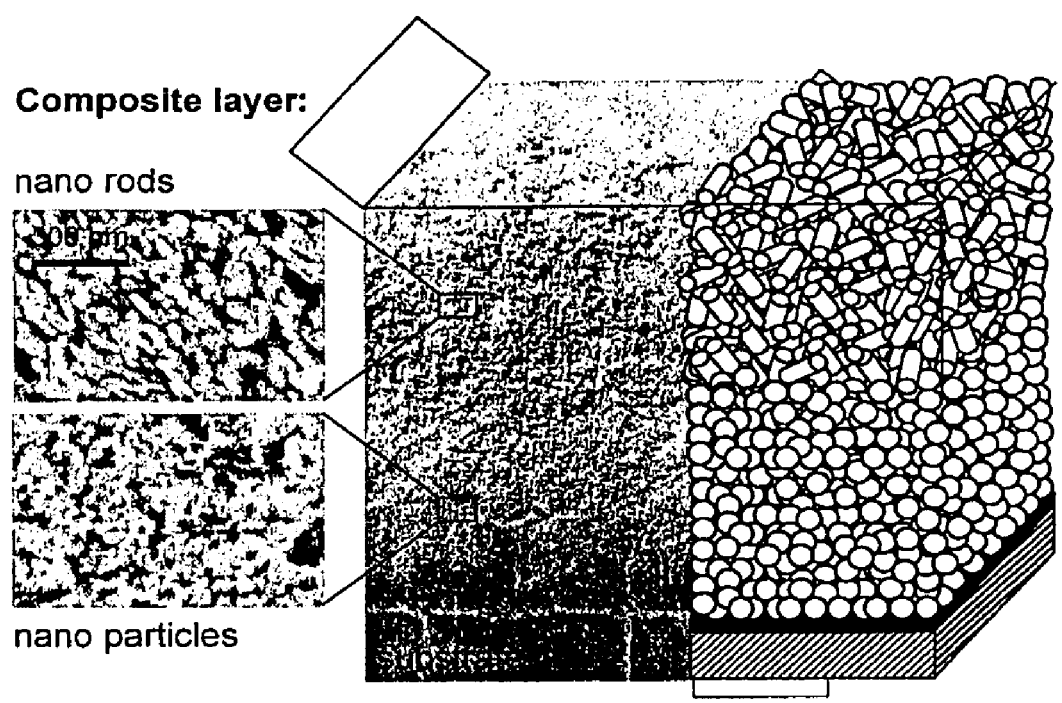
FIG. 6 shows a schematic diagram and a scanning electron micrograph of a SRCL according to the present invention.
Figure 7:
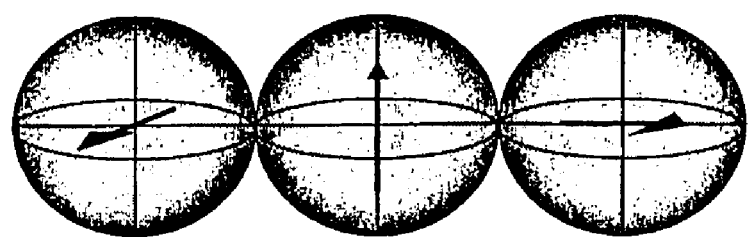
FIG. 7 shows the schematics of a chain of $TiO_2$-nanospheres and a chain of $TiO_2$ nanorods. The [001] direction contributes more in the case of the nanorods.
Figure 7:
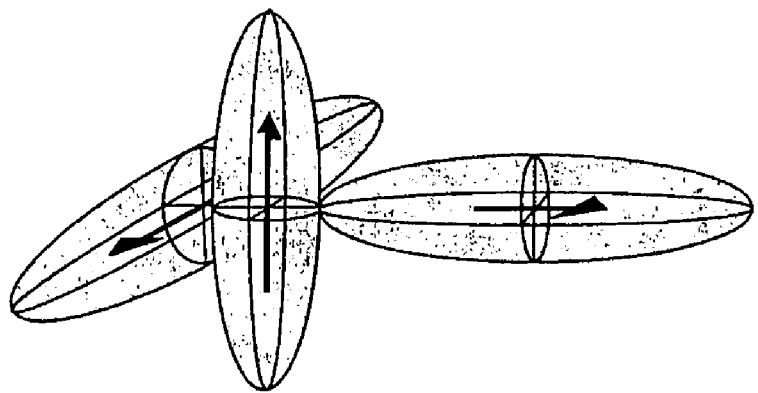
Figure 7:

The current-voltage-characteristics of such a solar cell is shown in FIG. 2 for illumination by 100 mW/cm$^2$ of simulated sun light (AM 1.5). A maximum power conversion efficiency of 7% can be extracted from the data. FIG. 3 shows the efficiency and the short circuit current density as a function of applied pressure. In contrast to earlier reported results on pressed films which were not prepared by means of lift-off techniques [Lindström et al., 2001, see above], both efficiency and J$_{SC}$ saturate at pressures not lower than 50 kN/cm$^2$. For non-lift-off layers, best values have been reported for pressures much lower, at about 5 kN/cm$^2$. One reason for this difference might be found in the pressure dependence of the porosity and efficiency of the pre-sintered (450° C.) but non-transferred layers as shown in FIG. 4. Neither efficiency, nor porosity show a strong dependence on pressure applied and keep their good properties during pressing. For non-pre-sintered films, however, the porosity decreases strongly with pressure and may be one reason for the worse performance and early saturation of efficiency with higher pressures of non-sintered but pressed films of larger thickness [Lindström et al., 2001, see above]. The importance of the small thickness of the adhesion layer is demonstrated in FIG. 5 where the efficiency of lift-off cells is shown as a function of the number of printing cycles when being ink-jet printed, each cycle equivalent to about 100 nm of layer thickness. A strong decrease of efficiency can be found for higher numbers of printing cycles.

EXAMPLE 2

Additionally, experiments on porous transfer layers dye sensitised before lifting-off the transfer layer from the first substrate have been conducted. The preparation follows a similar route as described for the first example but this time, a cell is produced having two adhesion layers and two transfer layers in alternating fashion on top of each other, with the transfer layers being dye sensitised. The order of layers is: substrate—adhesion layer 1—porous semicoductor layer 1 (dyed)—adhesion layer 2—porous semiconductor layer 2 (dyed). The transfer layers consist of porous TiO$_2$ layers of about 5 μm thickness only and only of particles of about 20 nm in diameter. The transfer layers have been sintered on a thin (approx. 20 nm) gold layer and after sintering, red dye molecules have been attached as a monolayer to TiO$_2$ via self-assembling out of a solution in ethanol (0.3 mM). The gold layer was then dissolved by an iodine/iodide mixture. A first porous layer (porous semiconductor layer 1) was transferred on a substrate covered with TCO (100 nm) and a thin layer (adhesion layer 1) of 100 nm thickness consisting of TiO$_2$ nanoparticles of about 14 nm in diameter. Adhesion layer 1 was applied by means of ink-jet printing techniques. After drying the first adhesion and transfer layer at room temperature, a second thin adhesion layer (adhesion layer 2) was applied by means of inkjet printing and a second dye sensitised porous layer (porous semiconductor layer 2) was transferred onto this second adhesion layer. After a second drying at room temperature, all the layers were sintered together by the application of 60 kN/cm$^2$ at room temperature. Power conversion efficiencies of up to approx. 4% (at irradiation of 100 mW/cm$^2$) have been measured for cells fabricated by transfer of such pre-dyed porous layers. In another experiment, the dye molecules of the second porous layer transferred onto the substrate were not red dye molecules but tri(isothiocyanato)(2,2':6',2"-terpyridyl-4,4',4"-tricarboxylic acid) ruthenium(II) molecules, black dye, with the absorption maximum shifted to longer wavelengths.

EXAMPLE 3

Additionally, experiments on porous transfer layers consisting of a double layer of spheres in the lower and rod-like shaped particles in the upper part have been performed. These composite layers have been fabricated as follows: on a thin gold layer on a glass substrate, first an approximately 5-μm-thick porous layers consisting of 20 nm spheres has been applied by means of screen printing. After drying at 80° C., an approx 5-μm-thick porous layer consisting of rods with a length of approx 100 nm and a diameter of approx 20 nm (ratio of largest axis:shortest axis=5) has been applied on top of the layer of spheres. The whole layer was then sintered at 450° C. Those SRCLs could be lifted off for further use in DSSC fabricated according to the lift-off techniques described above, e.g. removal of the gold layer by immersion in a gold-dissolving electrolyte. They were also used for the experiments shown in FIG. 8(b). In these experiments, the lifting-off of sphere-rod composite layers was compared to standard double layers consisting of spheres both in the upper and lower sublayer. The relative film area removed from various spare substrates is shown as a function of the duration of immersion of the layers in the gold-dissolving electrolyte; the removal of the sphere-rod composite layers is much easier than of the standard layers as indicated by the sharp onset of layer removal at 1 min for the SRCL ("composite layers") but no removal without additional forces for the standard double layers within the time scale of the experiment.

The features of the present invention disclosed in the specification, the claims and/or in the accompanying drawings, may, both separately, and in any combination thereof, be material for realising the invention in various forms thereof.

The invention claimed is:

1. A porous semiconductor film, comprising:
a substrate made of flexible material;
a porous semiconductor layer; and
an adhesion layer that provides electrical and mechanical contact between the porous semiconductor layer attached to said adhesion layer, and said substrate layer;
wherein said porous semiconductor layer and said porous adhesion layer are included in a sequence of alternating adhesions layers and porous semiconductor layers on top of each other, said porous semiconductor layers having been dyed or dye sensitized with one or several dyes, and the porous semiconductor layers further from the substrate, due to a presence of a respective dye, have centers of mass absorption shifted to longer wavelengths than the porous semiconductor layers closer to the substrate.

2. The porous semiconductor film of claim 1, wherein
said substrate is incapable of withstanding sintering temperatures >250 degrees Celsius,
said adhesion layer is a layer of semiconductor particles having sizes in a range of from 10 nm to 100 nm,
said adhesion layer has a porosity of 30% to 80%, with an average pore size in a range of from 1 nm to 100 nm,
said porous semiconductor layer includes semiconductor particles having sizes in a range of from 3 nm to 1000 nm,
said porous semiconductor layer has a pore size in a range of from 10 nm to 500 nm,
said porous semiconductor layer has a thickness in a range of from 1 µm to 50 µm, and
said porous semiconductor layer has a porosity in a range of from 30% to 80%, as measured by nitrogen absorption techniques.

3. An electronic device, comprising:
a solar cell; and
the porous semiconductor film of claim 1.

4. The electronic device of claim 3, wherein
the solar cell has a power conversion efficiency of >5%, and
the porous semiconductor film has a relative porosity of $\geq 75\%$, after a pressure of up to $10 \times 10^4$ N/cm$^2$ has been applied to the porous semiconductor film, said relative porosity being defined with respect to an unpressed porous semiconductor film.

5. An electronic device, comprising:
a sensor; and
the porous semiconductor film of claim 1.

* * * * *